(12) United States Patent
Frederick

(10) Patent No.: US 7,330,994 B2
(45) Date of Patent: Feb. 12, 2008

(54) CLOCK CONTROL OF A MULTIPLE CLOCK DOMAIN DATA PROCESSOR

(75) Inventor: Frank David Frederick, Austin, TX (US)

(73) Assignee: ARM Limited, Cambridge (GB)

( * ) Notice: Subject to any disclaimer, the term of this patent is extended or adjusted under 35 U.S.C. 154(b) by 399 days.

(21) Appl. No.: 11/114,240

(22) Filed: Apr. 26, 2005

(65) Prior Publication Data

US 2006/0242449 A1   Oct. 26, 2006

(51) Int. Cl.
*G06F 1/04* (2006.01)
*G06F 11/00* (2006.01)

(52) U.S. Cl. .................. 713/600; 713/500; 714/30; 714/726; 714/729; 714/731; 714/744

(58) Field of Classification Search ............... 713/600; 714/30
See application file for complete search history.

(56) References Cited

U.S. PATENT DOCUMENTS

| | | | |
|---|---|---|---|
| 6,877,123 B2 * | 4/2005 | Johnston et al. ............ | 714/731 |
| 6,966,021 B2 * | 11/2005 | Rajski et al. ............... | 714/726 |
| 7,120,844 B2 * | 10/2006 | Wu ............................ | 714/731 |

\* cited by examiner

*Primary Examiner*—Nitin C. Patel
(74) *Attorney, Agent, or Firm*—Nixon & Vanderhye P.C.

(57) ABSTRACT

A processor clock control device operable to control a plurality of clock signals output to a processor, said processor comprising a plurality of domains each clocked by a respective one of said plurality of clock signals, said processor being operable in different modes including a functional mode and a test mode, said processor clock control device comprising: a clock signal input operable to receive a slower reference clock signal or a higher speed operational clock signal; at least two clock signal outputs each operable to output a clock signal to a respective domain of said processor; a mode control signal input operable to receive a mode control signal indicating a mode of operation of said processor; a launch control signal input operable to receive a launch control signal, said launch control signal indicating portions of said processor to be tested; and an initiation signal input operable to receive an initiation signal indicating initiation of a processor test; wherein said processor clock control device is operable: in response to receipt of a test mode signal at said mode control signal input to receive a reference clock at said clock signal input and to output said reference clock at at least one of said plurality of clock signal outputs; and in response to a predetermined launch control signal received at said launch control signal input, said predetermined launch control signal indicating testing of a path between one of said clocked domains clocked by one of said clock signal outputs and one other of said clocked domains clocked by one other of said clock signal outputs, and following receipt of said initiation signal, to independently control said plurality of clock signal outputs such that at least one launch clock pulse is output from said one of said clock signal outputs while said one other of said clock signal outputs is suppressed, and following this to output at least one capture clock pulse from said one other of said clock signal outputs while said one of said plurality of clock signal outputs is suppressed.

25 Claims, 7 Drawing Sheets

CLOCK CONTROL OF A MULTIPLE CLOCK DOMAIN DATA PROCESSOR

BACKGROUND OF THE INVENTION

1. Field of the Invention

This invention relates to the field of data processing systems. More particularly, embodiments of this invention relate to the field of clock control of a multiple clock domain data processor and in particular clock control during scan testing of a multiple clock domain data processing system.

2. Description of the Prior Art

The scan testing of data processing circuits is known. Generally a test pattern is shifted into the processor via scan chains, the test is applied to the circuit for a predetermined number of functional clock pulses and the state of the processor after test is captured. Generally, the test patterns need to be input at a slow clock speed, and the output state of the processor needs to be clocked out at a slow clock speed. However, if it is required to test the operation of the circuit at an operational clocking speed then the circuit needs to be driven by clock pulses at this frequency. Where the clock is input externally to the core this is not a problem. However, in a processor core having multiple clock domains where the clock signals are generated by, for example, a PLL which can not be directly controlled at a top level interface of the chip it can be very difficult to control the different domains separately and enable the test patterns to be input, the test to be performed at speed and then the data to be extracted or captured.

SUMMARY OF THE INVENTION

Viewed from one aspect the present invention provides a processor clock control device operable to control a plurality of clock signals output to a processor, said processor comprising a plurality of domains each clocked by a respective one of said plurality of clock signals, said processor being operable in different modes including a functional mode and a test mode, said processor clock control device comprising: a clock signal input operable to receive a slower reference clock signal or a higher speed operational clock signal; at least two clock signal outputs each operable to output a clock signal to a respective domain of said processor; a mode control signal input operable to receive a mode control signal indicating a mode of operation of said processor; a launch control signal input operable to receive a launch control signal, said launch control signal indicating portions of said processor to be tested; and an initiation signal input operable to receive an initiation signal indicating initiation of a processor test; wherein said processor clock control device is operable: in response to receipt of a test mode signal at said mode control signal input to receive a reference clock at said clock signal input and to output said reference clock at at least one of said plurality of clock signal outputs; and in response to a predetermined launch control signal received at said launch control signal input, said predetermined launch control signal indicating testing of a path between one of said clocked domains clocked by one of said clock signal outputs and one other of said clocked domains clocked by one other of said clock signal outputs, and following receipt of said initiation signal, to independently control said plurality of clock signal outputs such that at least one launch clock pulse is output from said one of said clock signal outputs while said one other of said clock signal outputs is suppressed, and following this to output at least one capture clock pulse from said one other of said clock signal outputs while said one of said plurality of, clock signal outputs is suppressed.

The present invention recognises, that in order to test logic between two clock domains, test data must be input and then it must be launched from one domain, which will be referred to as the launch domain, and must be captured into the other domain, which will be referred to as the capture domain. This requires one (or more) launch clock pulses followed by one (or more) capture clock pulses. When testing the logic in the path between differently clocked domains, it is not only important to be able to control the clocking of the domain to be tested, but also to be able to stop the state of the other domain from changing. It is also not typically feasible to change clock control inputs between the launch and capture clock pulses. Thus, the present invention provides a technique that initially allows a slow reference clock to be output to the processor in response to a test mode signal, so that the test data can be clocked into the processor. It then controls the output and suppression of the output clocks, such that the testing can be performed at speed, while the switching of states in both launch and capture domains can be independently controlled.

In some embodiments said processor clock control device is operable in response to a further predetermined launch control signal, said further predetermined launch control signal indicating testing of at least two clocked domains of said processor in parallel, to output said at least one launch clock pulse from at least two of said clock signal outputs in parallel, and following this to output said at least one capture clock pulse from said at least two clock signal outputs in parallel.

Embodiments of the present invention provide the flexibility of being able to test different domains in parallel as well as testing the pathways between domains. This can be controlled at a top level using control input signals.

Embodiments of the present invention provide a processor clock control device operable in response to said predetermined launch control signal indicating testing of a path between one of said clock domains and at least one other of said clock domains, to independently control said plurality of clock signal outputs such that whilst said at least one launch clock pulse is output from said at least one of said clock signal outputs all of the other of said plurality of clock signal outputs are suppressed, and while said at least one capture clock pulse is output from said at least one other of said plurality of said plurality of clock signal outputs all of the other of said plurality of said clock signal outputs all of the other of said clock signal outputs are suppressed.

Although, it is particularly important in the present technique to suppress clocking of the capture domain during clocking of the launch domain, in many embodiments it is found to be helpful to suppress all of the other clock domains during clocking of the launch domain.

In some embodiments, said launch control input is operable to receive a launch control signal that further comprises a count portion operable to specify a number of launch pulses to be output, said clock control device is operable to output said number of launch pulses in response to said initiation signal.

Depending on the functionality being tested, it may be appropriate to have more than one launch pulse. Thus, in some embodiments a count signal is provided on the launch control input such that a tester can specify the number of launch pulses that should be used.

Preferably, said initiation signal and said launch control signal are input via external pins.

This gives a tester control over both of the signals and provides flexibility to the testing process.

In some embodiments, said mode control signal is input via an external pin, although in others it is entered in some other way. As the mode control signal remains constant during test procedure it is not necessary to provide top level access to this signal to the tester.

In some embodiments, said processor clock control device is operable to output said at least one capture pulse one period of a clock frequency after output of said at least one launch pulse, said clock frequency being a frequency of operation of said path between said one of said clocked domains and said one other of said clocked domains required during functional operation of said processor.

In order to test the pathway between two differently clocked domains at the frequency required during functional operation of the processor, the processor clock control device according to an embodiment of the invention is able to output the capture pulse or capture pulses one period of the required frequency after the launch pulse or pulses. Thus, the tester can see whether or not the data can travel down the pathway at the, required clocking speed frequency. Thus, an at speed testing of the pathway can be performed.

In some embodiments said at least one launch pulse and said at least one capture pulse are clock pulses from said higher speed operational clock signal.

When performing at speed testing, the pulses for the launch and capture pulses are those of the higher speed operational clock signal.

In some embodiments, following output of said at least one capture pulse said clock control device is operable to output said reference clock at at least one of said plurality of clock signal outputs.

Outputting the reference clock after the capture pulse or pulses enables the processor being clocked to have its resultant data clocked out at a suitable slow speed for analysis by the tester.

In some embodiments, the processor clock control device further comprises a plurality of clock signal divider circuits each operable in response to receipt of a functional mode control signal at said mode control input to receive said higher speed operational clock signal at said clock signal input and to divide said received signal to generate a plurality of output signals to be output by respective ones of said plurality of clock signal outputs.

The clock control device also comprises clock signal dividers, such that different speed output clocks can be output during normal operational or functional mode. This is controlled by a signal input to the clock control device, which indicates if normal functional operation or testing operations are to be performed.

The plurality of signal divider circuits are each operable to receive respective divider signals indicative of the dividing ratio to be performed by respective ones of said plurality of clock signal divider circuit at an input.

The clock frequencies of the output clock are controlled by primary inputs to the circuit and thus the speed of the different clocking domains can be controlled by an external operator.

In some embodiments said respective divider signals and said launch control signal are received at a same input, said launch control signal input, said processor clock control device being operable to route said received signals to said respective dividers in response to said functional mode signal being received on said mode control signal input.

In order to reduce the number of external pins on the device, preferred embodiments of this device allow the launch control signal to be input using the logic of the dividing circuits, this logic is already present in the circuit and thus, a saving in external pins and associated logic can be made. The control of the routing of the input signals is performed in response to the mode signal. In other words when a functional mode signal is applied to the device then the signals input at the launch control signal input are known by the device to be the dividing ratios and are routed to the respective dividers. In test mode, the device knows that they are the launch control signals and routes them accordingly.

Embodiments of the device also comprise a clock signal source operable to transmit a slower reference clock signal or a higher speed operational clock signal to said clock signal input.

The input device inputting the different clock signals to the clock control device, can be external to the device, or can form a part of a single composite device.

In some embodiments, the clock signal source is a PLL circuit.

In some embodiments, said clock signal source is operable to receive said initiation signal and a slow test signal, said clock signal source being operable to output said higher speed operational clock signal in response to said initiation signal when said slow test signal is not asserted, and to output said slower reference clock signal when said slow test signal is asserted.

A clock signal source which receives both an initiation signal and a slow test signal enables the clock signal source to be controlled by a tester to output the appropriate clock signals needed for a particular test procedure. The slow test signal enables slow DC testing to be performed in response to a signal applied to this input by an external tester. Thus, the tester can chose either at speed testing or DC testing, providing yet more flexibility to the device.

In some embodiments, said clock signal source further comprises a pulse count input operable to receive a pulse count signal, said clock signal source being operable to output a number of clock pulses specified in said pulse count signal in response to said initiation signal.

A pulse count signal input at the clock signal source enables a tester to specify the number of pulses output by the clock signal source following receipt of the initiation signal. Given that the number of launch pulses can be specified by a launch count in some embodiments, control of the number of pulses output to the clock control device effectively controls the number of capture pulses to be specified as the number of capture pulses will be the total number of pulses output specified by the pulse count signal minus the number of launch pulses specified by the launch count.

A further aspect of the present invention provides, a method of controlling a plurality of clock signals to be output to a processor, said processor comprising a plurality of domains each clocked by a respective one of said plurality of clock signals, said processor being operable in different modes including a functional mode and a test mode, said method comprising the steps of: receiving either a slower reference clock signal or a higher speed operational clock signal at a clock signal input; receiving a mode control signal, said mode control signal indicating a mode of operation of said processor at a mode control signal input; in response to receipt of a test mode signal, receiving said reference clock at said clock signal input and outputting said reference clock at at least one of a plurality of clock signal outputs; receiving a launch control signal at a launch control signal input, said launch control signal indicating portions of said processor to be tested; receiving an initiation signal indicating initiation of a processor test; and in response to a predetermined launch control signal received at said launch control signal input, said predetermined launch control signal indicating testing of a path between one of said clocked domains clocked by one of said clock signal outputs and one other of said clocked domains clocked by one other of said clock signal outputs, and following receipt of said initiation signal, independently controlling a plurality of clock signal outputs and outputting at least one launch clock pulse from one of said plurality of clock signal outputs while suppressing one other of said clock signal outputs, and following this outputting at least one capture clock pulse from said one other of said clock signal outputs while suppressing said one of said plurality of clock signal outputs.

A still further aspect of the present invention provides, a processor clock control means for controlling a plurality of clock signals output to a processor, said processor comprising a plurality of domains each clocked by a respective one of said plurality of clock signals, said processor being operable in different modes including a functional mode and a test mode, said processor clock control means comprising: a clock signal input means for receiving a slower reference clock signal or a higher speed operational clock signal; at least two clock signal output means for outputting at least two clock signals to respective domains of said processor; a mode control signal input means for receiving a mode control signal indicating a mode of operation of said processor; a launch control signal input means for receiving a launch control signal, said launch control signal indicating portions of said processor to be tested; and an initiation signal input means for receiving an initiation signal indicating initiation of a processor test; wherein said processor clock control means is operable: in response to receipt of a test mode signal at said mode control signal input means to receive a reference clock at said clock signal input means and to output said reference clock at at least one of said plurality of clock signal output means; and in response to a predetermined launch control signal received at said launch control signal input means, said predetermined launch control signal indicating testing of a path between one of said clocked domains clocked by one of said clock signal output means and one other of said clocked domains clocked by one other of said clock signal output means, and following receipt of said initiation signal, to independently control said plurality of clock signal output means such that at least one launch clock pulse is output from said one of said clock signal output means while said one other of said clock signal output means is suppressed, and following this to output at least one capture clock pulse from said one other of said clock signal output means while said one of said plurality of clock signal output means is suppressed.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
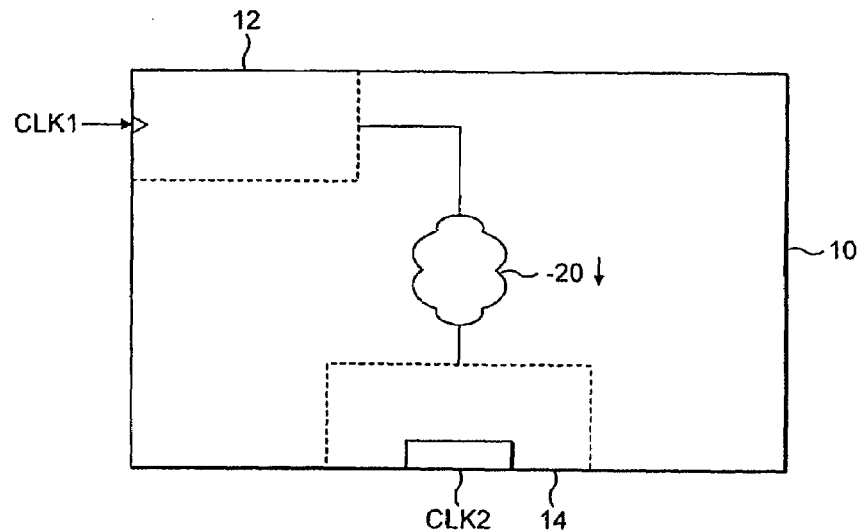
FIG. 1 schematically illustrates a processor core clocked by different clocks.

With reference to FIG. 1 a processor core 10 is shown in which domains 12, 14 are clocked by different clocks. In this simplified diagram two domains 12, 14 are shown, these domains are clocked by clocks, CLK1 and CLK2 respectively. Although only two domains clocked by different clocks are shown in this figure, it should be understood that in some embodiments further domains clocked by further clocks could be present. In a processor core having different domains clocked by different clocks, these domains will interact with each other. In the embodiment illustrated, domain 12 interacts with domain 14 via path 20. When testing this core it is important to be able to check that path 20 is able to function at the operational speed of the core 10. This operational speed is set in the specification of the core, and is often the slower of CLK1 and CLK2.

Figure 2:
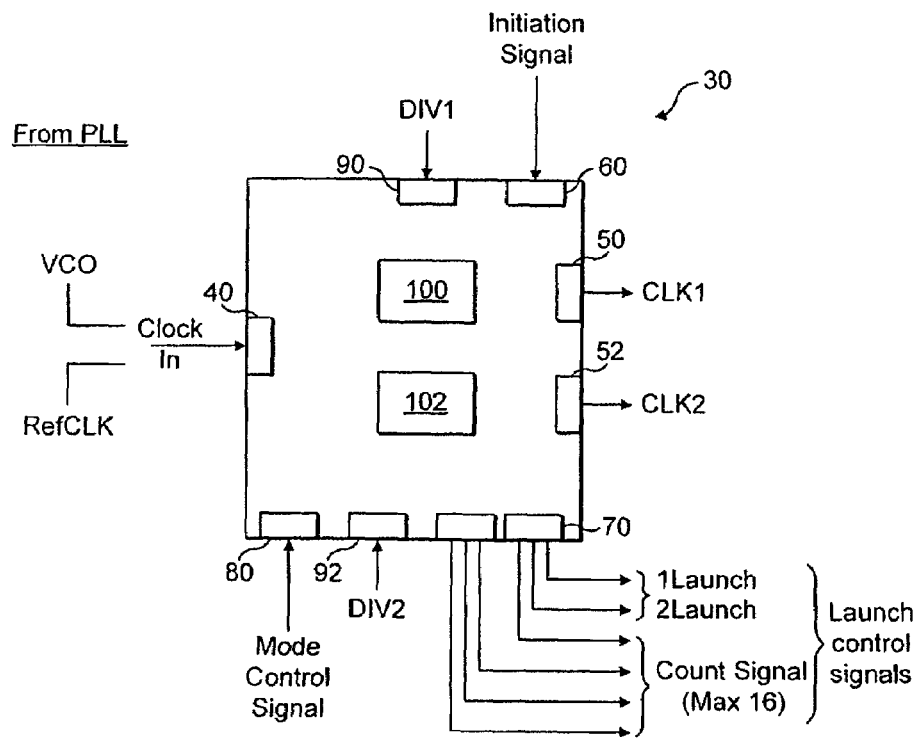
FIG. 2 schematically illustrates a clock control device according to an embodiment of the present invention.

FIG. 2 schematically shows a processor clock control device 30 according to an embodiment of the present invention. This processor clock control device can be used to clock the processor core shown in FIG. 1. Processor clock control device 30 comprises a clock input 40 operable to receive a clock signal from a PLL. The PLL can output a high speed clock signal VCO or a slower reference clock signals REFCLK. The clock input 40 receives one of these two signals. The processor clock control device 30 also comprises clock outputs 50, 52 operable to output CLK1 and CLK2 respectively. This is a simplified figure and it should be clear to the skilled person that more than two clock signals can be output depending on the number of domains to be clocked (see for example FIG. 7). Processor clock control device 30 comprises a number of other inputs, an initiation signal input 60 operable to receive an initiation signal and launch control signal inputs 70 operable to receive launch control signals. It also comprises a mode control signal input 80 which is operable to receive a mode control signal which controls whether the processor to be clocked by the clock output CLK1 and CLK2 is in normal functional mode or in test mode.

Processor clock control device 30 also comprises two additional inputs 90, 92 operable to receive division signal inputs DIV1 and DIV2. These signals are input to clock signal dividers 100, 102 respectively. These clock signal dividers operate to divide input clock signals input via clock signal input 40 by a certain amount. The certain amount depending on the inputs at DIV1 and DIV2 respectively. The divided clock signal output from 100, 102 are then output as clock signals CLK1 and CLK2 via clock signal outputs 50, 52 respectively during the normal functional mode of operation of the processor that it is driving, for example processor 10 of FIG. 1.

Processor clock control device 30 can operate to drive processor 10 of FIG. 1 in either a normal functional mode or in test mode, depending on the input at the mode control signal 80. When a functional mode control signal is input at 80 then processor clock control device 30 drives processor 10 of FIG. 1 in functional mode. During functional mode the clock input 40 is input into dividers 100, 102. These circuits operate as simple counters and according to the ratio determined by inputs DIV1 and DIV2 output a slower frequency signal by the required ratio. Thus, different frequency clock signals are output at CLK1 and CLK2. These divide circuits are generally simple flip flops which act to produce a nice clean clock signal. Thus, different frequency clock outputs are output at 50, 52 and are received by processor core 10 of FIG. 1 to clock domains 12 & 14 respectively.

When processor core 10 is to be tested a test control signal is input at mode control signal input 80. Following receipt of this signal the REFCLK clock is received at input 40 and is output on both clock outputs 50, 52. Thus, processor 10 is clocked at the slower REFCLK speed and any ATPG test patterns can be input into desired portions of this processor via the scan chains. After the test pattern data has been input to the processor, launch control signals can be entered via input 70. These specify which clock domains are to be tested and the number of launch pulses that are required. When this has been done, an initiation signal is input at initiation input 60. At this point, if logic in path 20 is to be tested, this being the path between domain 12 and domain 14 of the processor of FIG. 1, the input clock switches to VCO and clock output CLK 2 is suppressed while a number of launch pulses (the number being specified by the count signal) is output from CLK 1. When this has been done CLK 1 is suppressed and the remaining VCO pulses are output at CLK 2 as the capture pulses. A flow diagram showing this process in more detail is given in FIG. 3.

With regard to specifying and counting the number of launch pulses, this is described in more detail below. Processor clock control device 30 comprises a 4-bit counter operable to count the number of launch clock pulses delivered, thus, the upper bound in this embodiment is 15 launch clock pulses. This upper bound could easily be increased if needed by adding additional bits to the counter, and additional signal lines to the input count signal input bus. The counter is controlled by the initiation signal, and is available to the tester to control. When the initiation signal is low, the counter is reset to the value specified on the 4-bit input bus carrying the count signal DFTLAUNCHCNT. This is programmed for each scan chain pattern after the scan shift process has completed, i.e. after the scan chain data has been clocked into the processor. This can be done either by providing a 4-bit interface on the chip that the tester can control directly, or by incorporating a serial shift register interface that can be loaded while shifting in the scan chains. After the scan chains are input, the initiation signal is asserted, which begins the launch counter. While the launch counter is counting only clock pulses in the launch domain are allowed to pulse, all other clocks being suppressed. Once the counter has expired the launch clock is suppressed and only the capture clock is allowed to pulse. Once the launch and capture clock pulses have finished, the initiation signal is negated and the launch counter is once again reset and made ready for the next scan capture sequence.

In order to identify which output clock signal (CLK1 or CLK2) is the launch clock and which one is the capture clock, extra inputs are required to the clock control device 30, these are the launch control signals 1LAUNCH and 2LAUNCH. These inputs can either be directly controlled by the tester or can be driven by registers that are serially loaded during scan shifting. These inputs are encoded with the various options for test, which generally includes one option where all clocks pulse together which is needed for cases when not testing logic across clock domains. Additionally, options for every direction of data flow possible between clock domains should be included to allow comprehensive testing of the processor.

Although the inputs 90, 92 for the clock signal dividers 100, 102 are shown as separate inputs to those of the launch control signals 70, in some embodiments, these inputs may in fact be formed of the same pins, with a mulitplexer being used to divert the input signals to the correct portion of the device depending on the input at the mode control signal. In other words, when functional mode is indicated, the input signals are directed to the dividers, while when test mode is indicated they are directed to the test control of the output clocks.

Figure 3:
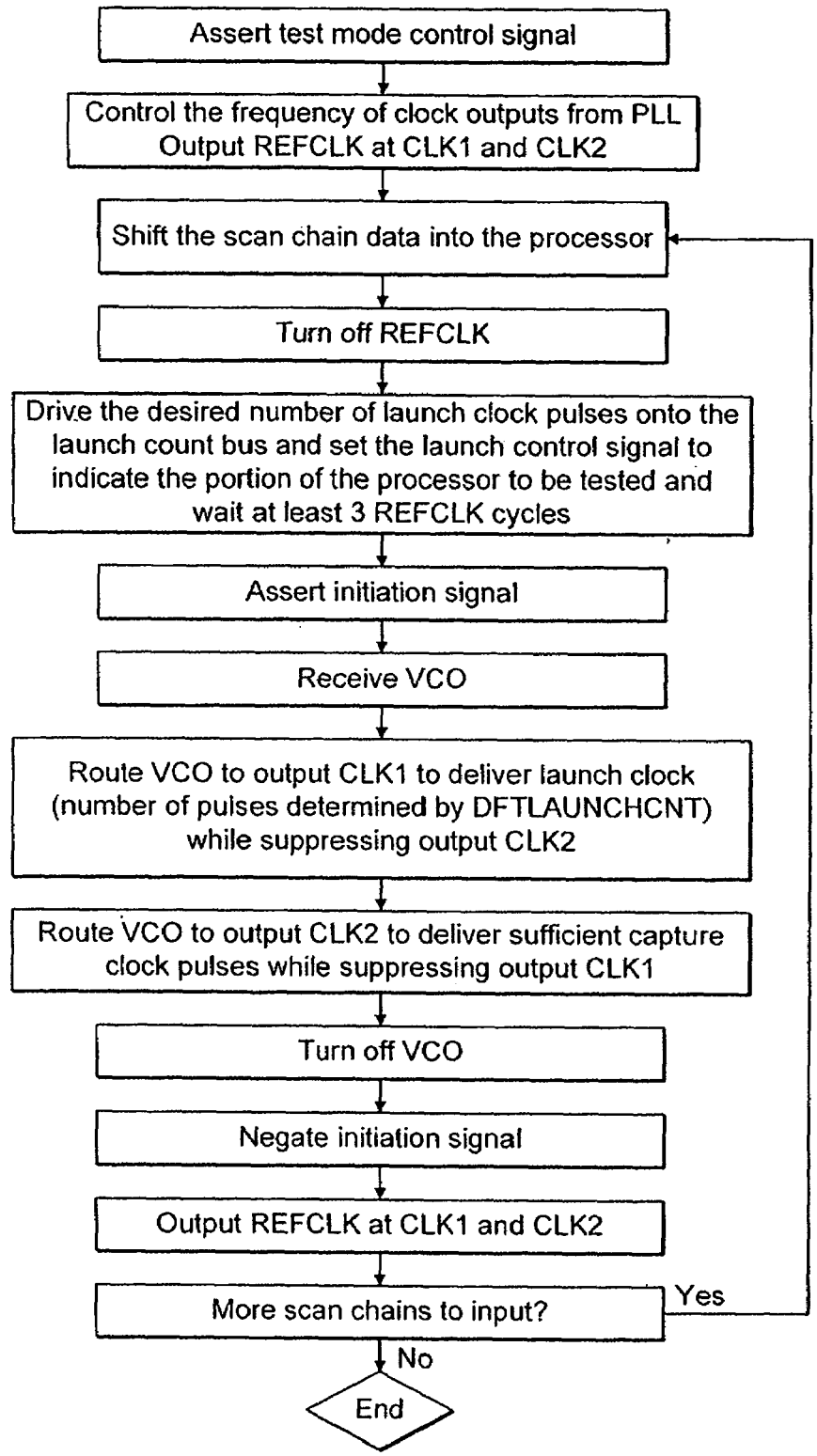
FIG. 3 shows a flow diagram illustrating the steps performed by the clock control device of FIG. 2.

FIG. 3 shows a flow diagram illustrating the steps performed by the processor clock control device 30 shown in FIG. 2 during testing of the logic in path 20 between different clocked domains shown in FIG. 1. As can be seen to start test mode, a test mode control signal is asserted, this is the DFTPLLTEST signal of FIG. 5 and later figures. This indicates that the processor is no longer operating in functional mode, but that a test is to start. The output clock from the PLL is therefore controlled to be the slower REFCLK. This allows, scan chain data to be shifted in to the processor. After this, the desired number of launch clock pulses are driven onto the count bus, i.e. LAUNCHCOUNT is set and the launch control signals LAUNCHCTL indicating the portion of the processor to be tested are also set. Next, REFCLK is switched off and the device waits for at least three REFCLK cycles. This allows the change in input clock speed and some control signals to be prepared and allows them to have transitioned to the correct value prior to being needed. The initiation signal is then asserted and the higher operational speed clock VCO is received. This clock is then routed to be output at CLK1. This is the launch clock and the number of pulses output is determined by DFTLAUNCHCNT, at this point output CLK2 is suppressed, this means that only the portion 12 of the processor 10 clocked by CLK1 can change state, portion 14 clocked by CLK2 is held. Then the remaining VCO pulses are routed to be output at CLK2 for the capture clock pulses while suppressing output CLK1. Thus, the state of portion 12 is held constant while that of portion 14 changes. Thus, the change of state of the two portions is carefully controlled, and the transfer of data between the two via path 20 (see FIG. 1) can be tested at speed. The VCO is shut off, indicating the end of the capture pulses. Then the initiation signal is negated and the at speed testing sequence is in effect over. Then REFCLK is output at CLK1 and CLK2, so that the test information can be shifted out of the processor. It is then determined if more scan chains are to be input and the process is repeated if they are, or it ends if they are not.

Figure 4:
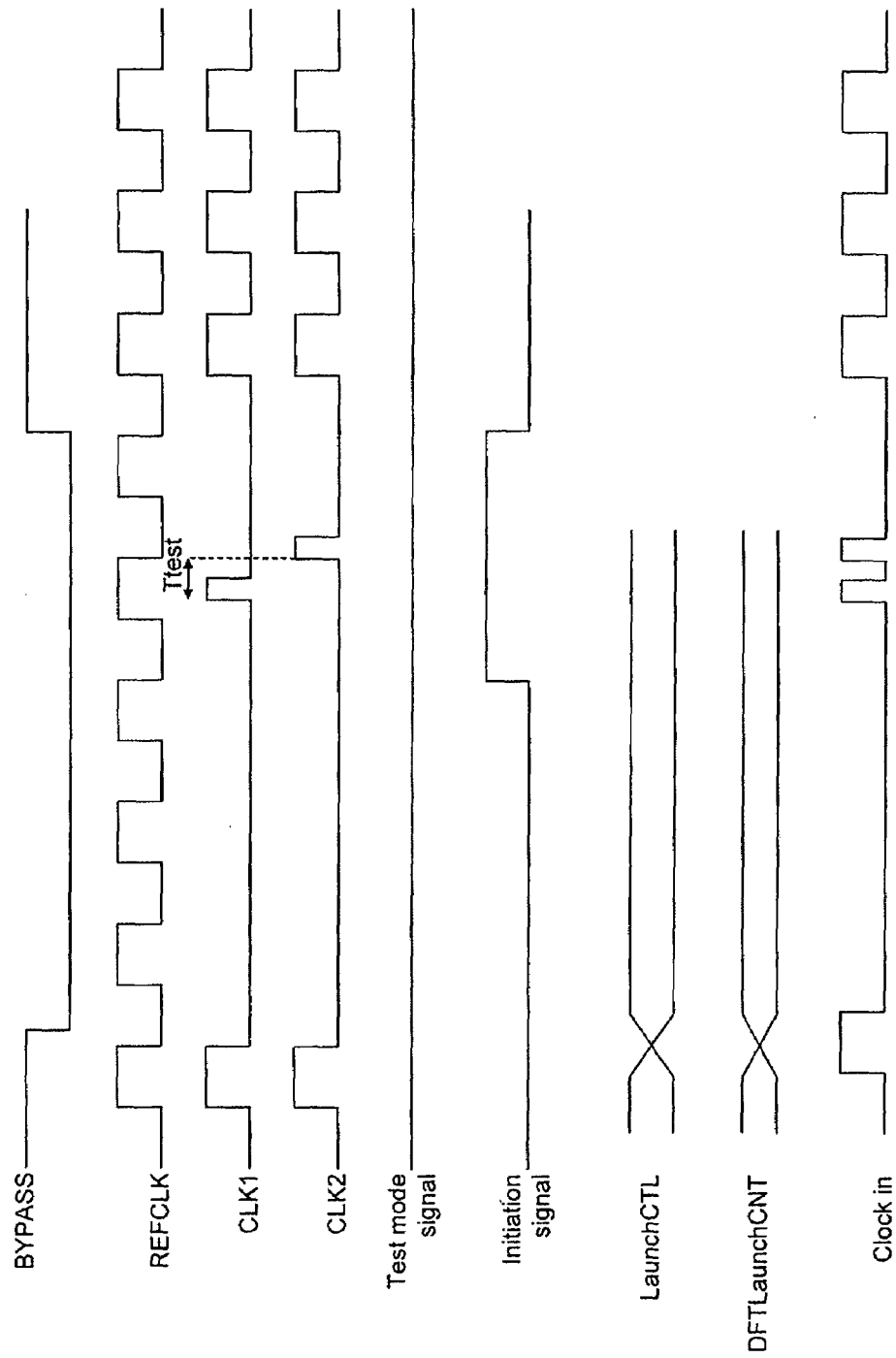
FIG. 4 is a timing diagram showing the clock pulses and signals input to the device of FIG. 2 in "at speed" test mode.

FIG. 4 shows a timing diagram of the signals and clock pulses of the clock control device of FIG. 2 during operational speed testing of processor 10. As can be seen initially the REFCLK clock is received at the clock signal input, clock in. During this time the scan chains are input into processor 10. Although only one REFCLK pulse is shown, in reality several are used, sufficient to clock in the required scan chain pattern. When the scan chain pattern has been input, the REFCLK clock is then suppressed for at least three cycles, which gives time for the scan enable and initiation signals to transition. In this embodiment the REFCLK clock is suppressed in response to a BYPASS signal going low. The initiation signal is then input and following receipt of the initiation signal the input signal received at the clock input switches to the faster operational clock, a pulse of this is output at CLK1 while CLK2 is suppressed, then the following pulse is output by CLK2 while CLK1 is suppressed. The test mode signal and LAUNCHCTL and DFTLAUNCHCNT signals are all received prior to the initiation signal. In this case, the DFTLAUNCHCNT signal has a value of one. If it were higher, then more of the faster clock pulses would be output by CLK1 prior to it being suppressed. The time period between the two pulses (Ttest shown in the Figure) is the test time of path 20 and relates to its operational frequency. The initiation signal then goes low and the BYPASS signal transitions to a high state again at which time the REFCLK clock is output on CLK1 and CLK2 again. This is used to shift out the test data. In order to prevent the switch to the REFCLK from corrupting the faster operational clock pulses, it is important to wait long enough after the operational clock pulses have been initiated before asserting the BYPASS signal. In this embodiment, the BYPASS signal is asserted at least 3 REFCLK cycles after the initiation signal was asserted. The initiation signal is negated at that time also. The initiation signal should remain asserted for long enough for the required number of operational clocks (specified by DFTLAUNCHCNT) to be output, it is unimportant when it is negated provided that this condition is met.

The processor clock control device 30 of FIG. 2 can also be used to provide a clocking signal suitable for testing a path from domain 14 of processor 10 of FIG. 1 clocked by CLK2 to domain 12 clocked by CLK1. If it is this path that is to be tested a suitable launch control signal is input at input 70 and this indicates to the processor that rather than outputting launch pulses on CLK1 while suppressing CLK2, these are output on CLK2 while suppressing CLK1. Similarly, capture pulses are output on CLK1 while suppressing CLK2. In all other respects the testing of this pathway is identical to the testing of the pathway 20 of domain 12 to domain 14.

Another possible use of the processor clock control device of FIG. 2 is to provide clocking pulses for the testing of domains 12 and 14 of the processor 10 of FIG. 1 in parallel. In this embodiment, both CLK1 and CLK2 output the launch pulses and capture pulses indicated by the count signal in parallel. This would be done if cross domain paths were disabled for the test.

As set out above the actual signals output on CLK1 and CLK2 depend on the domains to be tested and can be specified by the tester using the launch control signal. In the case illustrated in FIGS. 1 and 2, there are four possible testing scenarios, and thus there are two launch control input pins for the launch control signal and further pins for the COUNT signal.

The possible values of the launch control signals 1LAUNCH and 2LAUNCH shown in FIG. 2 are set out below

| 1LAUNCH | 2LAUNCH | Description |
| --- | --- | --- |
| 0 | 0 | Both CLK1 and CLK2 pulse for all cycles (single domain testing) |
| 1 | 0 | CLK1 pulses first, followed by CLK2 (tests paths from CLK1 to CLK2) |
| 0 | 1 | CLK2 pulses first, followed by CLK1 (tests paths from CLK2 to CLK1) |
| 1 | 1 | Neither clock pulses (no testing) |

A further possible embodiment of the invention allows the clock control device 30 of FIG. 2 to drive the clocks for DC testing rather than at speed testing. For this low frequency testing the clock will typically be the reference clock REFCLK and the VCO is never sent to the clock control device 30.

Figure 5:
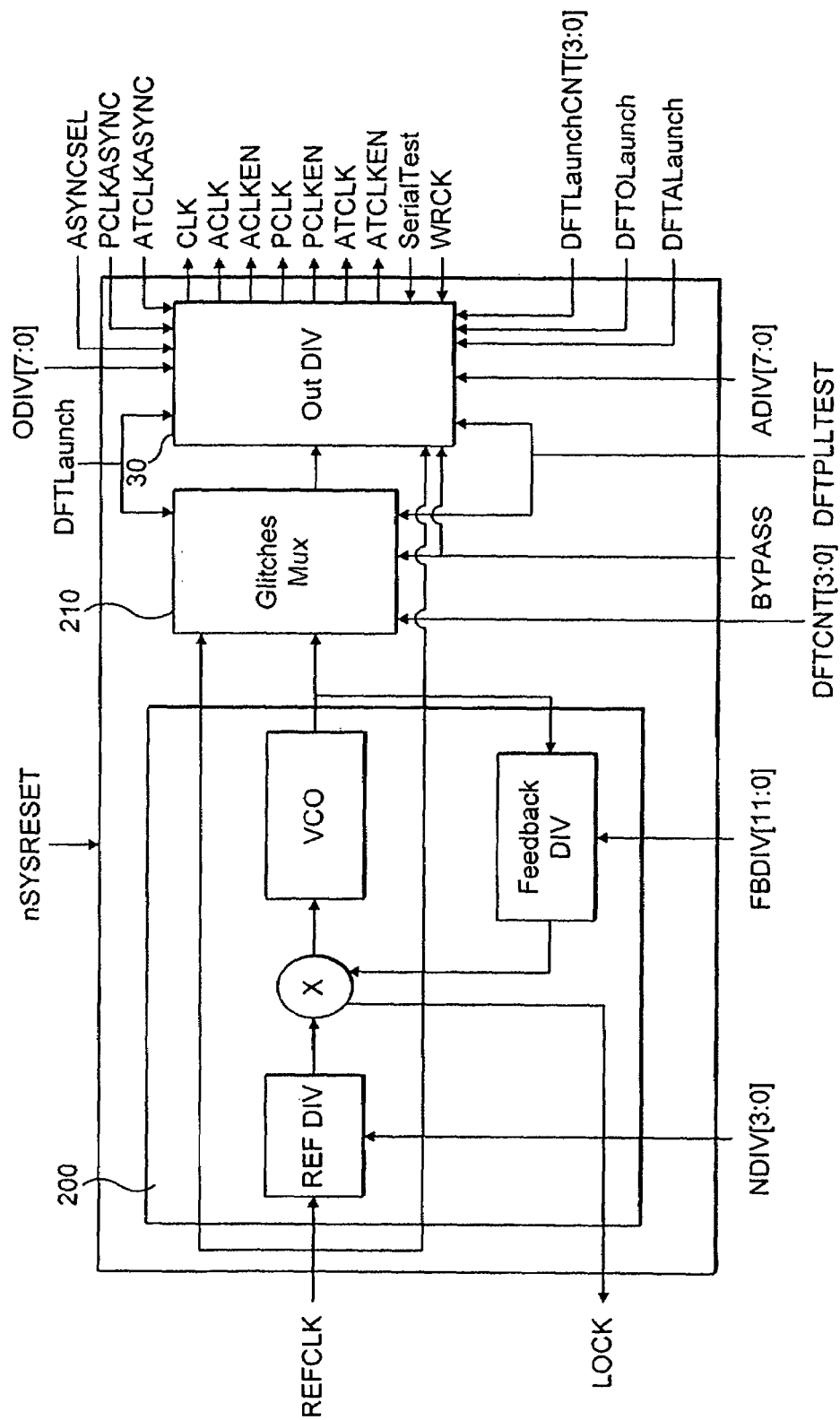
FIG. 5 shows a clock control device, clock source and glitchness multiplexer according to an embodiment of the present invention.

FIG. 5 schematically shows the clock control device 30 of FIG. 2 connected to the clock sources via a glitchless multiplexer. The clock sources shown in FIG. 5 arise from a PLL 200 which is driven by REFCLK. Thus, the PLL outputs two clock signals REFCLK and VCO to a glitchless multiplexer 210. The glitchless multiplexer selects one of the two signals and outputs it to the processor clock control device 30. The glitchless multiplexer switches between the clocks in such a way that glitches and runt pulses are inhibited. Although the glitchless multiplexer is the preferred way of switching between clock signals being provided to the processor clock control device, it should be noted that the input clocks could be provided to the clock control device 30 in a number of different ways, however in preferred embodiments it is done as shown in FIG. 5.

The glitchless multiplexer 210 has several input signals: A BYPASS signal, which indicates whether to output the REFCLK clock or the VCO clock. A DFTCNT signal, which indicates the number of launch and capture clock cycles that are required for a particular test sequence, and a DFTLAUNCH signal, this is the initiation signal of FIGS. 2 to 4 and acts to trigger the release of at speed pulses from the glitchless multiplexer 210, it also starts DFTLAUNCHCNT in clock control device 30. It also, along with the clock control device 30 receives a DFTPLLTEST signal, which is the mode control signal of FIG. 2 and indicates if operational or test mode is to be performed.

Clock control device 30 also receives the initiation signal which starts DFTLAUNCHCNT. Thus, in response to the initiation or DFTLAUNCH signal, a number of at speed test pulses indicated by DFTCNT are output from glitchless mux 210 to clock control device 30. These are output on one of the output clocks depending on the launch control signals received at DFTOLAUNCH and DFTALAUNCH. When the number of pulses indicated by DFTLAUNCHCNT have been output, the output of the clocks switch to capture clock cycles. Thus, in some embodiments, the output clock that was outputting the clock pulses is suppressed and the other output clock outputs the remaining at speed clock cycles sent from the glitchless mux 210. Thus, the number of capture clock pulses is determined by the value of DFTCNT minus DFTLAUNCHCNT. When these have all been received, the BYPASS signal is asserted and the DFTLAUNCH signal is negated and then the REFCLK is output from the clock control circuit 30 and the result data can be shifted out.

Figure 6:
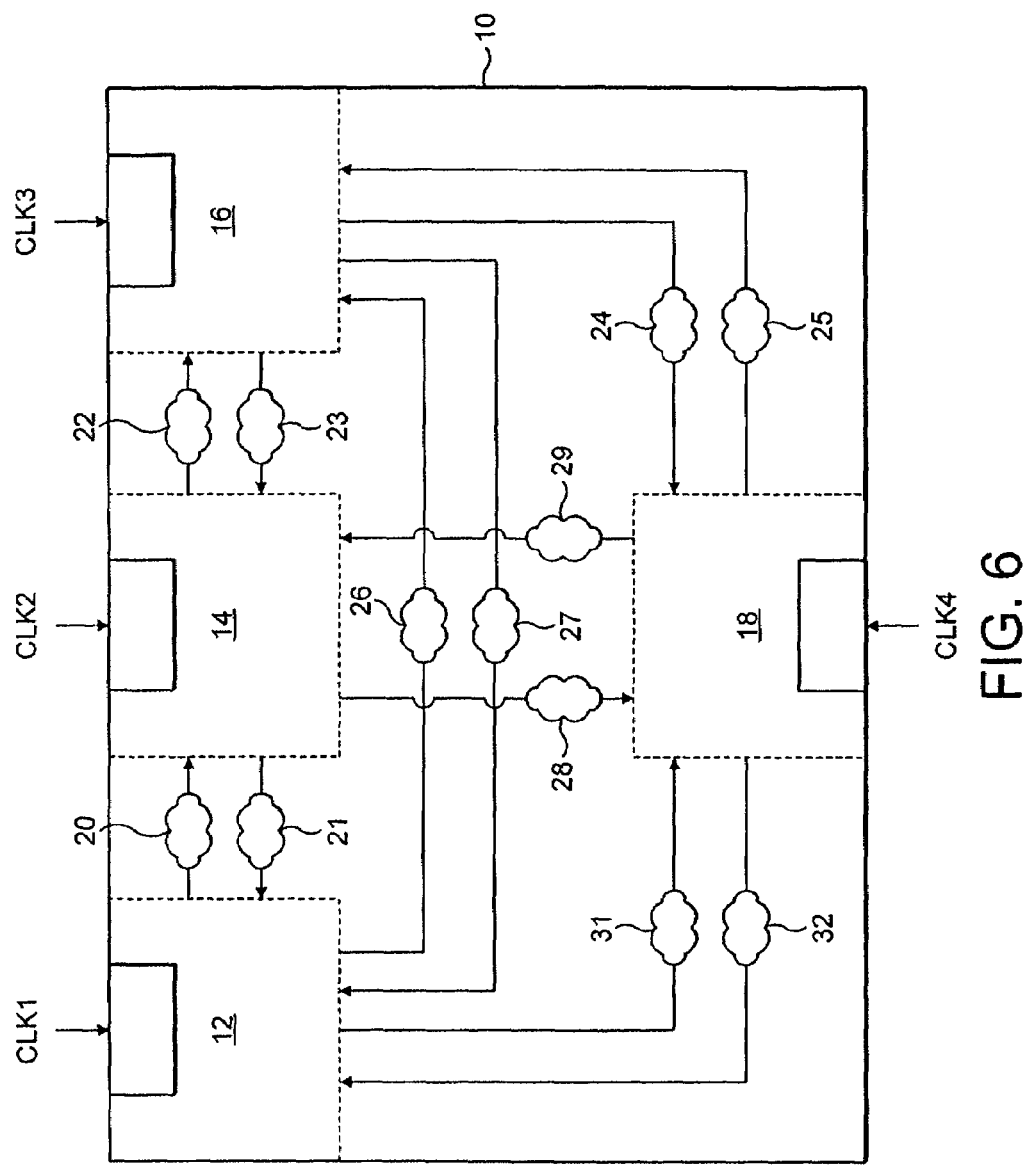
FIG. 6 schematically illustrates a processor core clocked by many different clocks.

FIG. 6 shows a processor similar to that of FIG. 1 but comprising multiple clock domains. In this processor, domains 12, 14, 16 and 18 are clocked by CLK1, CLK2, CLK3, CLK4 respectively. Paths between the respective domains are shown, and each path can be tested individually.

Figure 7:
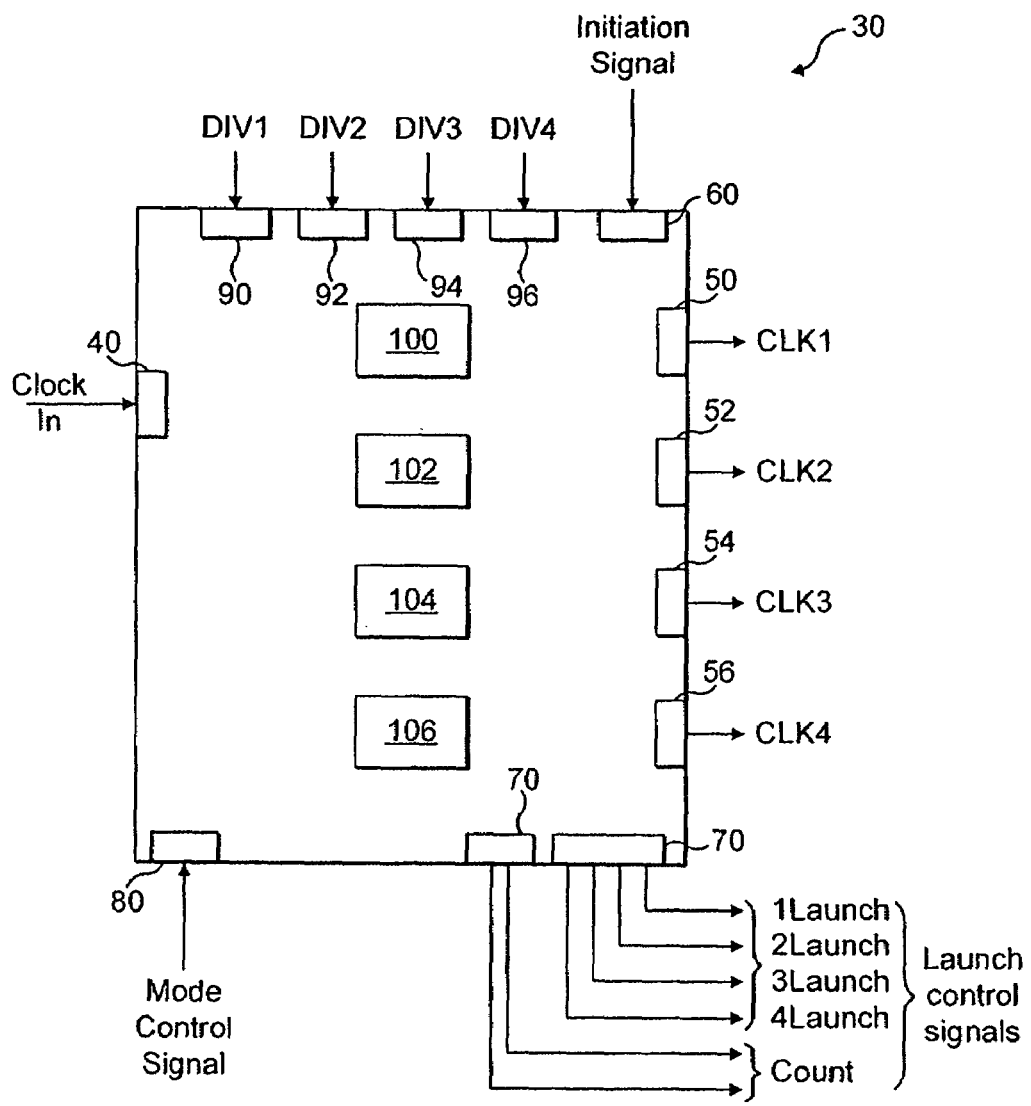
FIG. 7 shows a clock control device operable to supply four different output clocks to a processor.

FIG. 7 shows a clock control device 30 operable to test the respective paths of the multiple clock domains of FIG. 6. This device has four clock outputs 50, 52, 54, 56 operable to supply CLK1, CLK2, CLK3 and CLK4 to respective domains of processor 10. Similarly, it has four divider circuits, 100, 102, 104 and 106 operable to divide the input clock received at clock in 40 into different output frequencies depending on the numbers received at input 90, 92, 94 and 96. In this embodiment there are four LAUNCH signal inputs, operable to specify 13 different testing possibilities. That is to say any one of paths 20 to 32 between the different domains and all the domains operational in parallel.

During testing of pathways between domains, it is important to suppress the clock to the capture domain, while launch pulses are input to the launch domain, and similarly to suppress the clock to the launch domain while the capture domain is being clocked. However, in the case of processors having more than two domains what occurs in the other domains is less important. Generally, the clock control device is set up to suppress all other clocks, while the capture or launch pulses are being output, but this is not necessary and in some embodiments, the other clocks may be allowed to transition.

Further details concerning implementation of embodiments of the present invention are given below.

PLL

One embodiment of the test chip contains an on-board PLL which includes a VCO and some digital circuitry. The clocks required by the logic on the test chip silicon are provided either by the reference clock from an external source or by the PLL.

Figure 8:
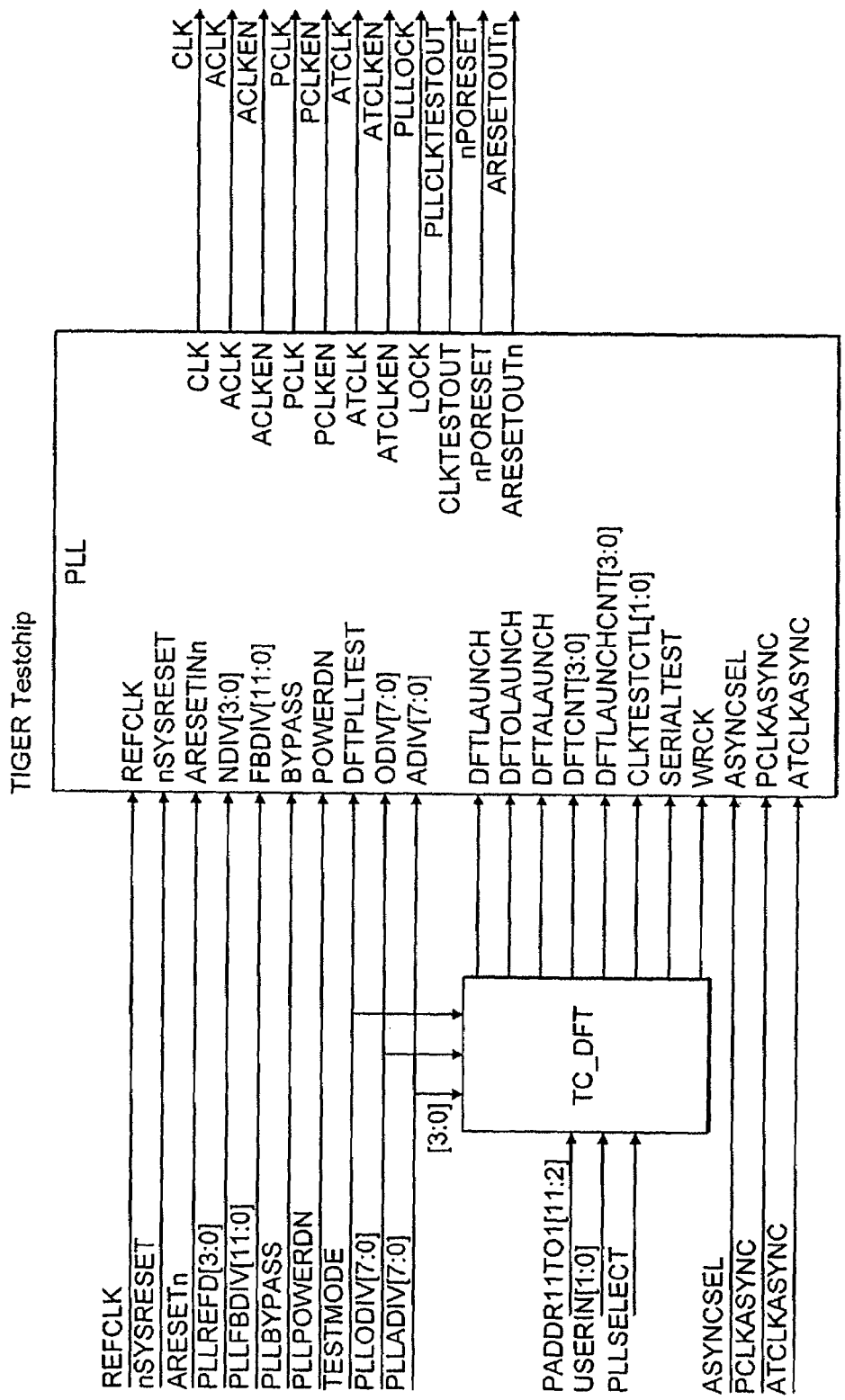
FIG. 8 shows test chip to PLL signal mapping.

FIG. 8 shows the top level test chip connectivity to the pins on the PLL. Table 1: PLL Signal descriptions describes the pins of the PLL and the mapping to the test chip pins.

TABLE 1

PLL Signal descriptions

| PLL pin name | Test chip pin name | Type | Description |
| --- | --- | --- | --- |
| REFCLK | REFCLK | Input | Reference clock |
| nSYSRESET | nSYSRESET | Input | Hard Reset input from testchip (active low). Resets PLL. |
| ARESETINn | ARESETn | Input | Soft Reset input from testchip (active low). Used as the source for nPORESET and ARESETOUTn reset outputs when DFTPLLTEST=1. |
| NDIV[3:0] | PLLREFDIV[3:0] | Input | Reference clock divider value |
| FBDIV[11:0] | PLLFBDIV[11:0] | Input | PLL multiplication factor |
| ODIV[7:0] | PLLODIV[7:0] when TESTMODE=0 | Input | CLK divider value |
| ADIV[7:0] | PLLADIV[7:0] when TESTMODE=0 | Input | ACLK divider value |
| BYPASS | PLLBYPASS | Input | Selects between REFCLK and VCO clock |
| POWERDN | PLLPOWERDN | Input | Power down the VCO |
| CLKTESTCTL[1:0] | USERIN[1:0] when PLLSELECT=1 | Input | Selects between the internal clocks for viewing on CLKTESTOUT<br>00 - ACLK<br>01 - ACLKEN<br>10 - CLK<br>11 - GCLK |
| DFTPLLTEST | TESTMODE | Input | Enables DFT clocking features. Must be set to 0 to disable test circuitry during normal functional operation. |
| DFTLAUNCH | PLLADIV[0] when TESTMODE=1 | Input | Activates DFT clock waveforms. Ignored when DFTPLLTEST=0. |
| DFTOLAUNCH | PLLADIV[1] when TESTMODE=1 | Input | DFT signal indicating launch from CLK-controlled domain. Ignored when DFTPLLTEST=0. |
| DFTALAUNCH | PLLADIV[2] when TESTMODE=1 | Input | DFT signal indicating launch from ACLK-controlled domain. Ignored when DFTPLLTEST=0. |
| WRCK | PLLADIV[3] when TESTMODE=1 | Input | DFT bypass clock signal for ACLK, PCLK, and ATCLK outputs (also for CLK when SERIALTEST=1). Ignored when DFTPLLTEST=0. |
| DFTCNT[3:0] | PLLODIV[3:0] when TESTMODE=1 | Input | Specifies number of at-speed DFT clock pulses to deliver. Ignored when DFTPLLTEST=0. |
| DFTLAUNCHCNT[3:0] | PLLODIV[7:4] when TESTMODE=1 | Input | Specifies number of at-speed DFT clock pulses that are in the launch domain. Ignored when DFTPLLTEST=0. |
| SERIALTEST | PADDR11TO2[8] when TESTMODE=1 & PADDR11TO2[2]=0 | Input | Toggles between WRCK (when high) and REFCLK (when low) as the source of the bypass clock for the CLK output when DFTPLLTEST=1 |
| ASYNCSEL | ASYNCSEL | Input | Selects between the asynchronous source (when high) and the synchronous source (same as CLK when low) for the PCLK and ATCLK clock outputs. Ignored when DFTPLLTEST=1. |
| PCLKASYNC | PCLKASYNC | Input | Asynchronous source for PCLK clock output. Ignored when ASYNCSEL=0 or DFTPLLTEST=1. |
| ATCLKASYNC | ATCLKASYNC | Input | Asynchronous source for ATCLK clock output. Ignored when ASYNCSEL=0 or DFTPLLTEST=1. |

TABLE 1-continued

PLL Signal descriptions

| PLL pin name | Test chip pin name | Type | Description |
| --- | --- | --- | --- |
| CLK | N/A | Output | High-speed clock. Connects to core only. |
| ACLK | ACLK[3:0] | Output | Slower clock derived from CLK. Replicated for each test chip output pin. |
| ACLKEN[2:0] | N/A | Output | Rising edge indicator from ACLK. Connects to core only. |
| PCLK | N/A | Output | Debug clock input on core. |
| PCLKEN[2:0] | N/A | Output | Rising edge indicator from PCLK. |
| ATCLK | N/A | Output | Trace macro clock input on core. |
| ATCLKEN[2:0] | N/A | Output | Rising edge indicator from ATCLK. |
| LOCK | PLLLOCK | Output | VCO lock indicator |
| CLKTESTOUT | PLLCLKTESTOUT when PLLSELECT=1 | Output | For viewing internal clocks |
| nPORESET | N/A | Output | Hard reset to core. Sourced from ARESETINn when DFTPLLTEST=1. |
| ARESETOUTn | N/A | Output | Soft reset to core. Sourced from ARESETINn when DFTPLLTEST=1. |

PLL Glitch-less Mux

During operational mode, the output clocks can be driven directly from the reference clock bypassing the VCO, or they can be driven from the VCO output clock. This is dictated by the BYPASS signal. The glitch-less mux ensures that transitions from the reference clock to VCO clock and vice versa, are glitch free[1]. This is ensured by two interacting state machines, one in the reference clock (REFCLK) domain and the other in the VCO clock (VCLK) domain.

[1] The term "glitch-free" indicates that the output of the glitch-less mux will not permit any pulse to be propagated from the input of the mux to the output of the mux that does not exactly match the exact waveforms of the inputs.

The glitch-less mux generates an output clock, GCLK, which is then used by the output dividers to generate the output clocks. The clocks are generated such that the skew among them is minimal, and this is done by each output being derived from an identical matching set of registers. Because the outputs must be passed through a register, the VCO must be able to operate at twice the maximum CLK frequency, i.e., if a maximum CLK frequency of 1 GHz is required, then the VCO must be capable of generating a 2 GHz output.

PLL Output Divider

During operational mode, the output clocks are integer multiples of the input reference clock, REFCLK. The output divider has counters clocked by GCLK that counts down from the divider value of each output clock. The rising edges of the output clocks will always be coincident. The output clock signals are toggled whenever their respective counter values reach the mid-point of their divider value or zero. This generates a clock whose frequency is GCLK frequency divided by 1 plus the divider value. The minimum divide ratio for is divide-by-2, implying that the frequency of the output clocks can never equal that of the reference clock. This is to meet the duty cycle requirements of the processor, which must guarantee a 50/50 duty cycle at the maximum operational speed. Note that the counter structure does not and will not guarantee a 50/50 duty cycle at lower frequencies, but the minimum phase width is guaranteed to never be violated.

Test Functionality

During DFT mode, when the DFTPLLTEST signal is asserted, the output divider values are forced into divide-by-2 mode, so the external values on the divider control pins are ignored. The feedback divider is used to control the frequency of the test clocks for a given REFCLK frequency (which defines the tester cycle period).

BYPASS operation is different during test mode. The core clocking is able to maintain a 1:1 divide ratio during scan shifting. This is because the output dividers are completely bypassed when BYPASS is asserted and DFTLAUNCH is negated, which is the state of these signals during scan shifting. A 1:1 ratio is not supported during operational mode, even when BYPASS is asserted. The output clocks ACLK, PCLK, and ATCLK are all driven from the same source suring DFT mode. This is ok because there are no logic paths between these clock domains in the core. These domains only communicate with the CLK domain, which is sourced separately at all times. Clock glitching is not possible on the output clocks as long as the "steps for performing at-speed testing" outlined below are followed.

The PLL includes the following features to aid in testing the core:
  At-Speed Testing
  Multiple Domain Testing
These features will be detailed in the following sections.

At-Speed Testing

In order to test the core at full frequency, the PLL must support the ability to apply the clock at a low frequency during scan shifting, and then switch to the high frequency for the capture cycles. As explained previously, the BYPASS signal is used to cleanly transition the output clocks between the REFCLK (slow) and VCO (fast) clock sources. This same feature is used during test to transition between shift clocking and capture clocking. The difference is that during test, the ATPG tool must be able to insert dead cycles (test cycles with no clock pulses) between the shift and capture cycles and it must be able to control the number of capture clock pulses that are delivered to the core.

The ability to insert dead cycles is provided with the DFTLAUNCH signal. Dead cycles are generated when both the BYPASS signal and the DFTLAUNCH signal are negated. When asserted, the DFTLAUNCH signal indicates that the at-speed capture clock pulses should begin. The number of capture clock pulses delivered is controlled with the DFTCNT [3:0] signals. The value of this bus is equal to the number of capture clock pulses that will be delivered with the exception that a value of zero is not allowed and, if selected, will be internally forced to a value of 1. The PLL should be switched to bypass mode (and shift clock pulses delivered) before another set of at-speed pulses are launched. (Only one ATPG launch/capture sequence per scan chain load/unload sequence is supported).

Multiple Domain Testing

The CLK, ACLK, PCLK, and ATCLK outputs of the PLL will each be used to clock different clock domains on the Tiger core. There are communication paths between the CLK domain and the other 3 domains, but there are no communication paths between any of the other 3 domains. Therefore, the ACLK, PCLK, and ATCLK outputs are always identical during test mode. To simplify the discussion, we will use ACLK to refer to any of the ACLK, PCLK, and ATCLK clock domains. In order to test the logic in these cross-domain paths, the ATPG tool must be able to pulse the clock of only one domain at a time during the capture cycles. This is true whether the PLL is in bypass mode or at-speed mode, since the different clock domains will not be skew balanced within the Tiger core. During bypass mode, the CLK domain is driven directly from the REFCLK pin and the ACLK domain is driven directly from the WRCK pin, which gives the ATPG the independent control it needs. The multiple-domain feature of the PLL enables this control during at-speed operation.

In order to allow a single clock to pulse at a time, the PLL supports the separation of the capture cycles into a launch domain, which is the first clock to pulse, followed by the capture domain pulses. The launch clock is specified using the DFTOLAUNCH and DFTALAUNCH pins as shown in Table 2. The number of pulses assigned to the launch clock is specified with DFTLAUNCHCNT[3:0]. The value assigned to this bus is equal to the number of launch clock pulses that will be delivered. The DFTLAUNCH signal must be asserted before the launch clock pulses can begin.

The number of pulses in the capture clock domain is determined by the remaining pulses specified by the DFTCNT[3:0] bus. If DFTLAUNCHCNT[3:0] is greater than or equal to DFTCNT[3:0], then all pulses specified by DFTCNT[3:0] will be in the launch clock domain. This allows the ability to pulse a single clock during the entire capture sequence if desired. Otherwise, the number of capture clock pulses is equal to DFTCNT[3:0] minus DFTLAUNCHCNT[3:0]. As with the DFTCNT[3:0] value, a value of zero for DFTLAUNCHCNT[3:0] is not allowed and will be internally forced to 1 if selected. The DFTLAUNCH signal is negated (and shift clock pulses delivered) before another launch to capture waveform sequence is delivered.

TABLE 2

Launch Domain Assignment

| DFTOLAUNCH | DFTALAUNCH | Description |
| --- | --- | --- |
| 0 | 0 | Both CLK and ACLK pulse for all cycles (single domain testing). |
| 0 | 1 | ACLK pulses first, followed by CLK (test paths from ACLK to CLK). |
| 1 | 0 | CLK pulses first, followed by ACLK (test paths from CLK to ACLK). |
| 1 | 1 | Neither clock pulses (no testing). |

Steps for Performing At-Speed Testing with the PLL

The steps for performing at-speed, multiple domain testing with the PLL are as follows:
1. Assert DFTPLLTEST, assert BYPASS, negate DFTLAUNCH, and set the values of feedback divider for the desired at-speed test frequency.
2. Reset the PLL
3. Wait for the VCO to achieve lock (indicated by the LOCK output).
4. Start shifting in the scan chain data.
5. After the last shift cycle, negate BYPASS, drive the total number of capture sequence pulses onto the DFTCNT[3:0] bus. If testing across clock domains, then drive the number of those pulses that should be assigned to the launch domain onto the DFTLAUNCHCNT[3:0] bus, and set DFTOLAUNCH and DFTALAUNCH depending on the direction of the current test (see Table 2).
6. The very next REFCLK cycle will be suppressed and dead cycles will be delivered to the core. At least 3 dead cycles are required to insure that the internal clocks are shut off and there is enough time before the PLL control is changed. This also allows time for the scan enable signal to transition cleanly.
7. Assert DFTLAUNCH to fire the at-speed launch and capture clock pulses internally.
8. Wait for the capture clock pulses to complete. This is most easily done by maintaining the capture vectors from the original ATPG pattern and using one tester cycle per capture vector. At least 3 REFCLK cycles are required to insure that the capture clocks have finished (any more will simply be dead cycles).
9. Negate DFTLAUNCH.
10. Assert BYPASS. It is not necessary to wait between negating DFTLAUNCH and asserting BYPASS, but doing so does not hurt anything (other than test time) as it simply causes more dead cycles to be inserted before the next shift sequence begins. The very next REFCLK pulse will pass through to the core beginning the next shift sequence.
11. Repeat steps 4 through 10 for each subsequent scan load and capture series in the test pattern.

I claim:
1. A processor clock control device operable to control a plurality of clock signals output to a processor, said processor comprising a plurality of domains each clocked by a respective one of said plurality of clock signals, said processor being operable in different modes including a functional mode and a test mode, said processor clock control device comprising:
a clock signal input operable to receive a slower reference clock signal or a higher speed operational clock signal;
at least two clock signal outputs each operable to output a clock signal to a respective domain of said processor;
a mode control signal input operable to receive a mode control signal indicating a mode of operation of said processor;
a launch control signal input operable to receive a launch control signal, said launch control signal indicating portions of said processor to be tested; and
an initiation signal input operable to receive an initiation signal indicating initiation of a processor test; wherein said processor clock control device is operable:
in response to receipt of a test mode signal at said mode control signal input to receive a reference clock at said clock signal input and to output said reference clock at at least one of said plurality of clock signal outputs; and in response to a predetermined launch control signal received at said launch control signal input, said predetermined launch control signal indicating testing of a path between one of said clocked domains clocked by one of said clock signal outputs and one other of said clocked domains clocked by one other of said clock signal outputs, and following receipt of said initiation signal, to independently control said plurality of clock signal outputs such that at least one launch clock pulse is output from said one of said clock signal outputs while said one other of said clock signal outputs is suppressed, and following this to output at least one capture clock pulse from said one other of said clock signal outputs while said one of said plurality of clock signal outputs is suppressed.

2. A processor clock control device according to claim 1, wherein said processor clock control device is operable in response to a further predetermined launch control signal, said further predetermined launch control signal indicating testing of at least two clocked domains of said processor in parallel, to output said at least one launch clock pulse from at least two of said clock signal outputs in parallel, and following this to output said at least one capture clock pulse from said at least two clock signal outputs in parallel.

3. A processor clock control device according to claim 1, wherein in response to said predetermined launch control signal indicating testing of a path between one of said clocked domains and at least one other of said clocked domains, said processor clock control device is operable to independently control said plurality of clock signal outputs such that while said at least one launch clock pulse is output from said at least one of said clock signal outputs all of the other of said plurality of clock signal outputs are suppressed, and while said at least one capture clock pulse is output from said at least one other of said plurality of clock signal outputs all of the other of said plurality of clock signal outputs are suppressed.

4. A processor clock control device according to claim 1, said launch control signal input being operable to receive a launch control signal that further comprises a count portion operable to specify a number of launch pulses to be output, said clock control device being operable to output said number of launch pulses in response to said initiation signal.

5. A processor clock control device according to claim 1, wherein said initiation signal and said launch control signal are input via external pins.

6. A processor clock control device according to claim 1, wherein said mode control signal is input via an external pin.

7. A processor clock control device according to claim 1, wherein said processor clock control device is operable to output said at least one capture pulse one period of a clock frequency after output of said at least one launch pulse, said clock frequency being a frequency of operation of said path between said one of said clocked domains and said one other of said clocked domains required during functional operation of said processor.

8. A processor clock control device according to claim 7, wherein said at least one launch pulse and said at least one capture pulse are clock pulses from said higher speed operational clock signal.

9. A processor clock control device according to claim 8, wherein following output of said at least one capture pulse said clock control device is operable to output said reference clock at at least one of said plurality of clock signal outputs.

10. A processor clock control device according to claim 1, further comprising a plurality of clock signal divider circuits each operable in response to receipt of a functional mode control signal at said mode control input to receive said higher speed operational clock signal at said clock signal input and to divide said received signal to generate a plurality of output signals to be output by respective ones of said plurality of clock signal outputs.

11. A processor clock control device according to claim 10, wherein said plurality of signal divider circuits are each operable to receive respective divider signals indicative of the dividing ratio to be performed by respective ones of said plurality of clock signal divider circuit at an input.

12. A processor clock control device according to claim 11, wherein said respective divider signals and said launch control signal are received at a same input, said launch control signal input to said processor clock control device being operable to route said received signals to said respective dividers in response to said functional mode signal being received on said mode control signal input.

13. A processor clock control device according to claim 1, further comprising a clock signal source operable to transmit a slower reference clock signal or a higher speed operational clock signal to said clock signal input.

14. A processor clock control device according to claim 13, wherein said clock signal source comprises a PLL circuit.

15. A processor clock control device according to claim 13, wherein said clock signal source is operable to receive said initiation signal and a slow test signal, said clock signal source being operable to output said higher speed operational clock signal in response to said initiation signal when said slow test signal is not asserted, and to output said slower reference clock signal when said slow test signal is asserted.

16. A processor clock control device according to claim 15, said clock signal source further comprising a pulse count input operable to receive a pulse count signal, said clock signal source being operable to output a number of clock pulses specified in said pulse count signal in response to said initiation signal.

17. A method of controlling a plurality of clock signals to be output to a processor, said processor comprising a plurality of domains each clocked by a respective one of said plurality of clock signals, said processor being operable in different modes including a functional mode and a test mode, said method comprising the steps of:
receiving either a slower reference clock signal or a higher speed operational clock signal at a clock signal input;
receiving a mode control signal, said mode control signal indicating a mode of operation of said processor at a mode control signal input;
in response to receipt of a test mode signal receiving said reference clock at said clock signal input and outputting said reference clock at at least one of a plurality of clock signal outputs;
receiving a launch control signal at a launch control signal input, said launch control signal indicating portions of said processor to be tested;
receiving an initiation signal indicating initiation of a processor test; and
in response to a predetermined launch control signal received at said launch control signal input, said predetermined launch control signal indicating testing of a path between one of said clocked domains clocked by one of said clock signal outputs and one other of said clocked domains clocked by one other of said clock signal outputs, and following receipt of said initiation signal, independently controlling a plurality of clock signal outputs and outputting at least one launch clock pulse from one of said plurality of clock signal outputs while suppressing one other of said clock signal outputs, and following this outputting at least one capture clock pulse from said one other of said clock signal outputs while suppressing said one of said plurality of clock signal outputs.

18. A method according to claim 17, wherein in response to a further predetermined launch control signal, said further predetermined launch control signal indicating testing of at least two clocked domains of said processor in parallel, and following receipt of said initiation signal, controlling said plurality of clock signal outputs to output said at least one launch clock pulse from at least two of said clock signal outputs in parallel, and following this to output said at least one capture clock pulse from said at least two clock signal outputs in parallel.

19. A method according to claim 17, wherein in response to said predetermined launch control signal indicating testing of a path between one of said clocked domains and at least one other of said clocked domains, independently controlling said plurality of clock signal outputs to output said at least one launch clock pulse from said at least one of said clock signal output while suppressing all of the other of said plurality of clock signal outputs, and to output said at least one capture clock pulse from said at least one other of said plurality of clock signal outputs while suppressing all of the other of said plurality of clock signal outputs.

20. A method according to claim 17, wherein said launch control signal further comprises a count portion operable to specify a number of launch pulses to be output, and outputting said number of launch pulses in response to said initiation signal.

21. A method according to claim 17, wherein input of said initiation signal and said launch control signal is done via external pins.

22. A method according to claim 17, wherein said step of outputting said at least one capture pulse is performed one period of a clock frequency after output of said at least one launch pulse, said clock frequency being a frequency of operation of said path between said one of said clocked domains and said one other of said clocked domains required during functional operation of said processor.

23. A method according to claim 22, wherein said at least one launch pulse and said at least one capture pulse are clock pulses from said higher speed operational clock signal.

24. A method according to claim 17, comprising the further step of following output of said at least one capture pulse outputting said reference clock at at least one of said plurality of clock signal outputs.

25. A processor clock control means for controlling a plurality of clock signals output to a processor, said processor comprising a plurality of domains each clocked by a respective one of said plurality of clock signals, said processor being operable in different modes including a functional mode and a test mode, said processor clock control means comprising:

a clock signal input means for receiving a slower reference clock signal or a higher speed operational clock signal;

at least two clock signal output means for outputting at least two clock signals to respective domains of said processor;

a mode control signal input means for receiving a mode control signal indicating a mode of operation of said processor;

a launch control signal input means for receiving a launch control signal, said launch control signal indicating portions of said processor to be tested; and an initiation signal input means for receiving an initiation signal indicating initiation of a processor test; wherein said processor clock control means is operable:

in response to receipt of a test mode signal at said mode control signal input means to receive a reference clock at said clock signal input means and to output said reference clock at at least one of said plurality of clock signal output means; and in response to a predetermined launch control signal received at said launch control signal input means, said predetermined launch control signal indicating testing of a path between one of said clocked domains clocked by one of said clock signal output means and one other of said clocked domains clocked by one other of said clock signal output means, and following receipt of said initiation signal, to independently control said plurality of clock signal output means such that at least one launch clock pulse is output from said one of said clock signal output means while said one other of said clock signal output means is suppressed, and following this to output at least one capture clock pulse from said one other of said clock signal output means while said one of said plurality of clock signal output means is suppressed.

* * * * *